US010241745B1

(12) United States Patent
McDowell

(10) Patent No.: US 10,241,745 B1
(45) Date of Patent: Mar. 26, 2019

(54) APPARATUS, A SYSTEM AND A METHOD OF CREATING MODIFIABLE ANALOG PROCESSING

(71) Applicant: McDowell Signal Processing, LLC, Mountain View, CA (US)

(72) Inventor: Colin McDowell, Palo Alto, CA (US)

(73) Assignee: McDowell Signal Processing, LLC., Mountain View, CA (US)

( * ) Notice: Subject to any disclaimer, the term of this patent is extended or adjusted under 35 U.S.C. 154(b) by 144 days.

(21) Appl. No.: 15/178,404

(22) Filed: Jun. 9, 2016

Related U.S. Application Data

(60) Provisional application No. 62/279,507, filed on Jan. 15, 2016.

(51) Int. Cl.
*G06F 17/00* (2006.01)
*G06F 3/16* (2006.01)

(52) U.S. Cl.
CPC .................................... *G06F 3/165* (2013.01)

(58) Field of Classification Search
CPC ....................................................... G06F 3/165
See application file for complete search history.

(56) References Cited

U.S. PATENT DOCUMENTS

2002/0154773 A1* 10/2002 Standard .................. E04H 3/22 380/236
2009/0290727 A1* 11/2009 Seefeldt ............... H03G 3/3089 381/107
2010/0195840 A1* 8/2010 Ciccone ............... G10H 1/0091 381/61
2012/0195445 A1* 8/2012 Inlow .................. G11B 27/038 381/119

OTHER PUBLICATIONS

Hannes, Bieger, Tegeler Audio Manufaktur VTRC, Valve Channel Strip, Sound on Sound Magazine, SOS on Test, Jan. 2016, pp. 94-98.

Hugh, Robjohns, Wes Audio Mimas, Digitally Controlled FET Compressor, Sound on Sound Magazine, SOS on Test, Jan. 2016, pp. 124-127.

(Continued)

*Primary Examiner* — Joseph Saunders, Jr.
(74) *Attorney, Agent, or Firm* — Haverstock & Owens LLP

(57) ABSTRACT

Embodiments of the present invention are directed to a hybrid system for analog audio processing with digital control. The hybrid system utilizes an analog processing box (APB) that is coupled with a computer to digitally control parameter calculations and other parts of the system, and for parameter automation and parameter preset recall. The APB includes algorithms that are implemented in the analog domain using a combination of raw algorithm functions and is configurable such that selected analog algorithm(s) can be realized using the same analog implementation. The APB lacks external, physical moving controls and internal circuitry to calculate control signals. Instead, control signals are transmitted with audio signals in complete synchronization from the computer to the APB via a single path for the control of the APB. The selected analog algorithm is configurable based on modification of side-chain, signal processing that is performed outside of the APB.

20 Claims, 4 Drawing Sheets

(56) References Cited

OTHER PUBLICATIONS

Vintage King Audio Advertisement, Sound on Sound Magazine, Jan. 2016, pp. 32-33.

Hasler et al. Cooperative Analog-Digital Signal Processing, IEEE, 2002, 4 pages.

Burlingame et al., An Analog CMOS High-Speed Continuous-Time FIR Filter, Solid-State Circuits Research Laboratory, Department of Electrical and Computer Engineering, 3 pages.

Srinivasan et al., Low-Power Realization of FIR Filters Using Current-Mode Analog Design Techniques, IEEE, 2004, 5 pages.

* cited by examiner

APPARATUS, A SYSTEM AND A METHOD OF CREATING MODIFIABLE ANALOG PROCESSING

RELATED APPLICATIONS

This application claims benefit of priority under 35 U.S.C. section 119(e) of the co-pending U.S. Provisional Patent Application Ser. No. 62/279,507, filed Jan. 15, 2016, entitled "MCDSP ANALOG PROCESSING BOX," which is hereby incorporated by reference in its entirety.

FIELD OF INVENTION

The present invention relates to the field of audio processing. More particularly, the present invention relates to an apparatus, a system and a method of creating modifiable analog processing.

BACKGROUND OF THE INVENTION

Analog processing equipment for audio is generally expensive due to component costs. Further, the mythology associated with many analog processing products have driven their market value even higher. Some manufacturers of analog processing products have been troubled with "re-issues" of highly coveted products from decades past.

Several manufacturers of digital audio processing products (software and hardware) have gone to great lengths to understand the behavior of analog electronics and their implementations for audio processing, in order to replicate the sounds of the analog product in their own digital version. Yet, the professional music production market still places high value on the use of all analog processing, either because of some perceived value of using vintage equipment or the belief that digital processing, be it performed on PCIe cards, proprietary boxes or using a computer's own CPU, is inferior to the analog processing equivalent.

FIG. 1A illustrates a traditional system 100 used in a music studio by audio engineers. A digital audio workstation (DAW) software program 110 running on a computer 105 can be used to handle an entire production process of recording tracks, applying effects such as EQ and compression, and mixing down to a final deliverable. Yet, audio engineers continue to employ analog outboard gear 125 to augment the production process. Some even go as far as using an analog mixing console 125 to adjust the levels of all the tracks, and simply use the computer 105 as a recorder and playback device. The usefulness of analog outboard gear 125 is subjective, but analog processing is a highly preferable addition to any otherwise all digital production.

The system 100 illustrated in FIG. 1A includes the computer 105 connected to an audio interface 115 via a connection 130, the audio interface 115 connected to a patch bay 120 via connections 135, and the patch bay 120 connected to the analog outboard gear 125 via a separate connection 140 for each individual analog outboard box 125. Each outboard box 125 includes moving parts, such as knobs, switches, sliders, buttons and the like, to set parameter data for altering sound. The analog outboard equipment 125 cannot recall every setting related to the production mix. As such, audio engineers must notate, using pen and paper, what settings were used for each outboard unit 125 used, for every session they do. Audio engineers will do this hundreds of sessions every year, making this process tedious, time consuming and prone to error.

Some equipment manufacturers have created analog outboard gear 125' that is controllable by the computer 105 via a USB 150, using a plugin (software program) 145 running alongside the DAW software 140 on the computer 105, as shown in another traditional system 100' illustrated in FIG. 1B. The software control 145 can recall settings for each session and automate certain controls of the analog outboard gear 125'. However, there are several issues with the traditional system 100'. For example, each outboard unit 125, 125' (collectively, 125) implements a single algorithm that is not reconfigurable, and is only capable of running one channel of audio through it, each with its own parameter settings. The cost of the outboard equipment 125 is the same, if not increased, by the availability of the software control 145. The analog equipment 125 still has all original moving parts, such as knobs, buttons, faders and the like, to set parameter data to thereby adjust the algorithm inside each device 125. The addition of the computer control 145 is auxiliary, not primary. Furthermore, synchronization of audio playback and control changes is not guaranteed, as control changes are sent to the analog equipment 125 along a different signal path than audio signals are sent. The audio signals are routed through digital to analog converters in the audio interface 115 to the analog outboard gear 125, are processed by the analog outboard gear 125, and then are routed through analog to digital converters in the audio interface 115 to be converted back to the digital domain to the computer 105 running the DAW software 110 (namely, connections 130, 135 and 140). Meanwhile, the control signal is sent from the software control 145 via USB (namely, connection 150) to the analog outboard gear 125.

BRIEF SUMMARY OF THE INVENTION

Embodiments of the present invention are directed to a hybrid system for analog audio processing with digital control. The hybrid system utilizes an analog processing box (APB) that is coupled with a computer to digitally control parameter calculations and other parts of the system, and for parameter automation and parameter preset recall. The APB includes algorithms that are implemented in the analog domain using a combination of raw algorithm functions and is configurable such that selected analog algorithm(s) can be realized using the same analog implementation. The APB lacks external, physical moving controls and internal circuitry to calculate control signals. Instead, control signals are transmitted with audio signals in complete synchronization from the computer to the APB via a single path for the control of the APB. The selected analog algorithm is configurable based on modification of side-chain, signal processing that is performed outside of the APB.

In one aspect, a system for music production is provided. The system includes an all-digital control processing component and an all-analog signal processing component coupled with the all-digital control processing component via a multi-point connector. The all-digital control processing component is configured to calculate raw algorithm values to obtain a digital control signal and to combine a digital audio signal and the digital control signal together in the same data stream for transmission. The all-analog signal processing component is configured to receive the digital audio signal and the digital control signal synchronized in the same data stream via the multi-point connector, and is configured to thereby provide an audio effect using the received digital audio and digital control signals.

In some embodiments, the all-digital control processing component is executed on a computing device.

In some embodiments, the all-digital control processing component is also configured to generate a graphical user interface on the computer to receive user input, and the raw algorithm values are calculated based on the user input.

In some embodiments, the all-digital control processing component is also configured to recall settings previously set.

In some embodiments, the all-analog signal processing component is configured to automatically receive update of control values during playback such that control changes can be recorded and repeated with the playback.

In some embodiments, the all-analog signal processing component includes a digital to analog converter circuit to simultaneously convert the digital audio signal to analog audio signal and to convert the digital control signal to analog control signal, an audio processing circuit implementing at least one algorithm for processing the analog audio signal in the analog domain, and an analog to digital converter circuit to convert an output from the audio processing circuit to the digital domain to be returned to the all-digital control processing component.

In some embodiments, implementation of the at least one algorithm is a combination of only raw algorithm functions including multiply, add and accumulate functions.

In some embodiments, the at least one algorithm implemented by the audio processing circuit is configurable by modification of the digital control signal in the all-digital control processing component.

In some embodiments, the at least one algorithm implemented by the audio processing circuit in the all-analog signal processing component is a dynamic range control algorithm. Alternatively or in addition to, the at least one algorithm implemented by the audio processing circuit in the all-analog signal processing component is a signal summing algorithm. Alternatively or in addition to, the at least one algorithm implemented by the audio processing circuit in the all-analog signal processing component is a frequency equalization algorithm.

In some embodiments, the all-analog signal processing component is a standalone device that is distinct and external from the computing device.

In some embodiments, the all-analog signal processing component does not have any circuitry to calculate control signals and does not have any physical moving controls.

In another aspect, an all-analog signal processing component is provided. The all-analog signal processing component includes an input/output port configured to couple with a multi-point connector and to receive a digital audio signal and a digital control signal synchronized in the same data stream via the multi-point connector, a digital to analog converter circuit to simultaneously convert the digital audio signal to analog audio signal and to convert the digital control signal to analog control signal, an audio processing circuit implementing at least one algorithm for processing the analog audio signal in the analog domain, and an analog to digital converter circuit to convert an output from the audio processing circuit to the digital domain to be transmitted out of the all-analog signal processing component via the input/output port.

In some embodiments, implementation of the at least one algorithm is a combination of only raw algorithm functions including multiply, add and accumulate functions.

In some embodiments, the all-analog signal processing component does not have any circuitry to calculate control signals and does not have any physical moving controls.

In some embodiments, the all-analog signal processing component is configured to be communicatively coupled with a computing device such that the digital audio signal and the digital control signal are received from the computing device, and the converted output from the audio processing circuit is returned to the computer.

In some embodiments, the at least one algorithm implemented by the audio processing circuit is configurable by modification of the digital control signal received from the computer.

In yet another aspect, a method of an all-analog signal processing component is provided. The all-analog signal processing component is configured to be communicatively coupled with a computing device. The all-analog signal processing component is a standalone device that is distinct and external from the computing device. The method includes receiving a digital audio signal and a digital control signal synchronized in the same data stream at an input/output port of the all-analog signal processing component from the computing device, simultaneously converting the digital audio signal to analog audio signal and the digital control signal to analog control signal by a digital to analog converter circuit of the all-analog signal processing component, processing the analog audio signal in the analog domain by an audio processing circuit of the all-analog signal processing component, wherein the audio processing circuit implements at least one algorithm, and converting the processed signal by an analog to digital converter circuit of the all-analog signal processing component to the digital domain to be transmitted out of the all-analog signal processing component via the input/output port of the all-analog signal processing component.

In some embodiments, the method also includes providing a first effect and a second effect that is different from the first effect on the received audio signal by using a first set of control data for the first effect and a second set of control data that is different from the first set for the second effect.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

In the following description, numerous details are set forth for purposes of explanation. However, one of ordinary skill in the art will realize that the invention can be practiced without the use of these specific details. Thus, the present invention is not intended to be limited to the embodiments shown but is to be accorded the widest scope consistent with the principles and features described herein.

Embodiments of the present invention are directed to a hybrid system for analog audio processing with digital control. The hybrid system utilizes an analog processing box (APB) that is coupled with a computer to digitally control parameter calculations and other parts of the system, and for parameter automation and parameter preset recall. The APB includes algorithms that are implemented in the analog domain using a combination of raw algorithm functions and is configurable such that selected analog algorithm(s) can be realized using the same analog implementation. The APB lacks external, physical moving controls and internal circuitry to calculate control signals. Instead, control signals are transmitted with audio signals in complete synchronization from the computer to the APB via a single path for the control of the APB. The selected analog algorithm is configurable based on modification of side-chain, signal processing that is performed outside of the APB.

Figure 2:
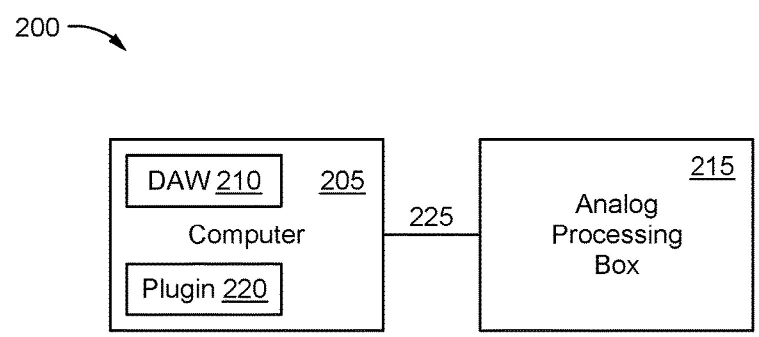
FIG. 2 illustrates an exemplary system in accordance with the some embodiments.

FIG. 2 illustrates an exemplary system 200 in accordance with the some embodiments. The system 200 includes computer 205 and a DAW software program 210 running on the computer 205. The system 200 also includes an APB 215 (analog processing box). Briefly, the APB 215 includes one or more configurable analog algorithms that are each defined as per user selection of one of a plurality of plugins 220 available to operate the APB 215. Details of the APB 215 and the plugins 220 are further discussed below. The computer 205 and the APB 215 are coupled via a multi-point connector, such as Thunderbolt. The connectors 225 transmits signals (audio and control signals) from the computer 205 to the APB 215 transmits signals (processed audio signals) from the APB 215 to the computer 205 all along the same cable 225. Other connectors, such as AVB (audio video bridging), Ethernet, Dante and another high bandwidth connector can be used instead. The APB 215 is controlled by the selected plugin 220 running alongside the DAW software 210 on the computer 205.

Figure 3:
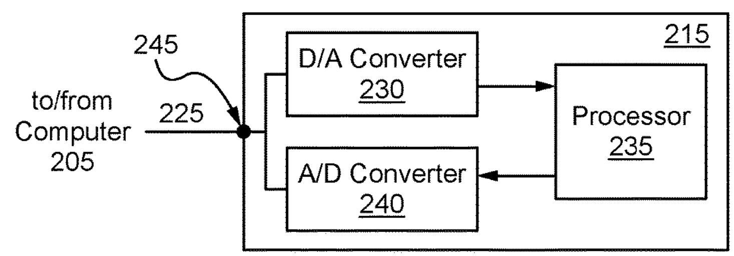
FIG. 3 illustrates an exemplary block diagram of the APB of FIG. 2 in accordance with some embodiments.

FIG. 3 illustrates an exemplary block diagram of the APB 215 of FIG. 2 in accordance with some embodiments. The APB 215 includes at least one input/output port 245. In some embodiments, the APB 215 includes at least two input/output ports 245. Audio and control signals are received in complete synchronization from the computer 205 at the input/output port 245 of the APB 215 via the connector 225, which is coupled at the input/output port 245 of the APB 215. Within the APB 215, the audio and control signals are split into different streams of data, but they originate from the same single connection 225 to the APB 215. These digital signals are converted to analog signals by a digital to analog (D/A) converter circuit 230. The analog signals are thereafter passed to and processed by a processor circuit 235 in the analog domain. The processed signals are then converted back to digital signals by an analog to digital (A/D) converter circuit 240 to be returned out from the input/output port 245 of the APB 215 to the computer 205 via the connector 225. The connector 225 is a Thunderbolt connector or the like.

The processor circuit 215 includes at least one signal processing algorithm that is implemented in the analog domain. This analog domain implementation is a combination of only the raw algorithmic functions, namely multiply, add and accumulate operations needed to created the desired audio effect. From these basic operations, algorithms such as dynamic range control, signal summing (combining of audio channels) and frequency equalization (filtering) can be realized.

The APB 215 also includes other components, such as a power switch to power the APB 215 and a heat removing element to remove heat generated within the APB 215. The APB 215 can include one or more indicator lights. However, the APB 215 lacks external, moving controls such as knobs, buttons, faders and the like. Nor are there internal circuits to convert human readable control valves (such as gain dB, attack in milliseconds, frequency in Hertz) to raw algorithmic values. Rather, the APB 215 receives the control data from the computer 205 via the multi-point connector 225 as parameter calculations and side-chain processing are performed on the computer 205. Put differently, all algorithm control along with side-chain functionality are done digitally via the plugin 220, while all algorithm processing of the audio data is done in the analog domain (e.g., in the APB 215).

Figure 1A:
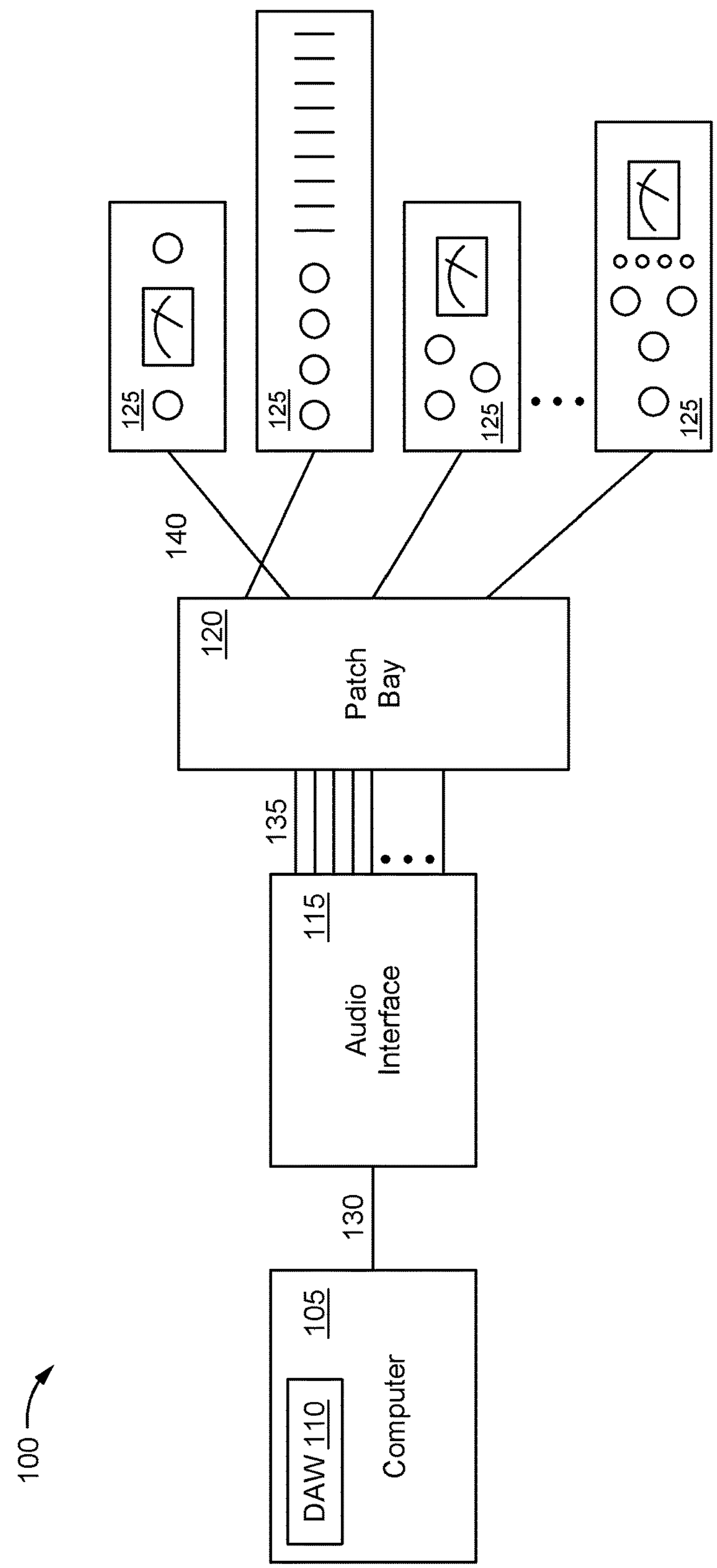
FIGS. 1A-1B illustrate different traditional systems used by audio engineers.
Figure 1B:
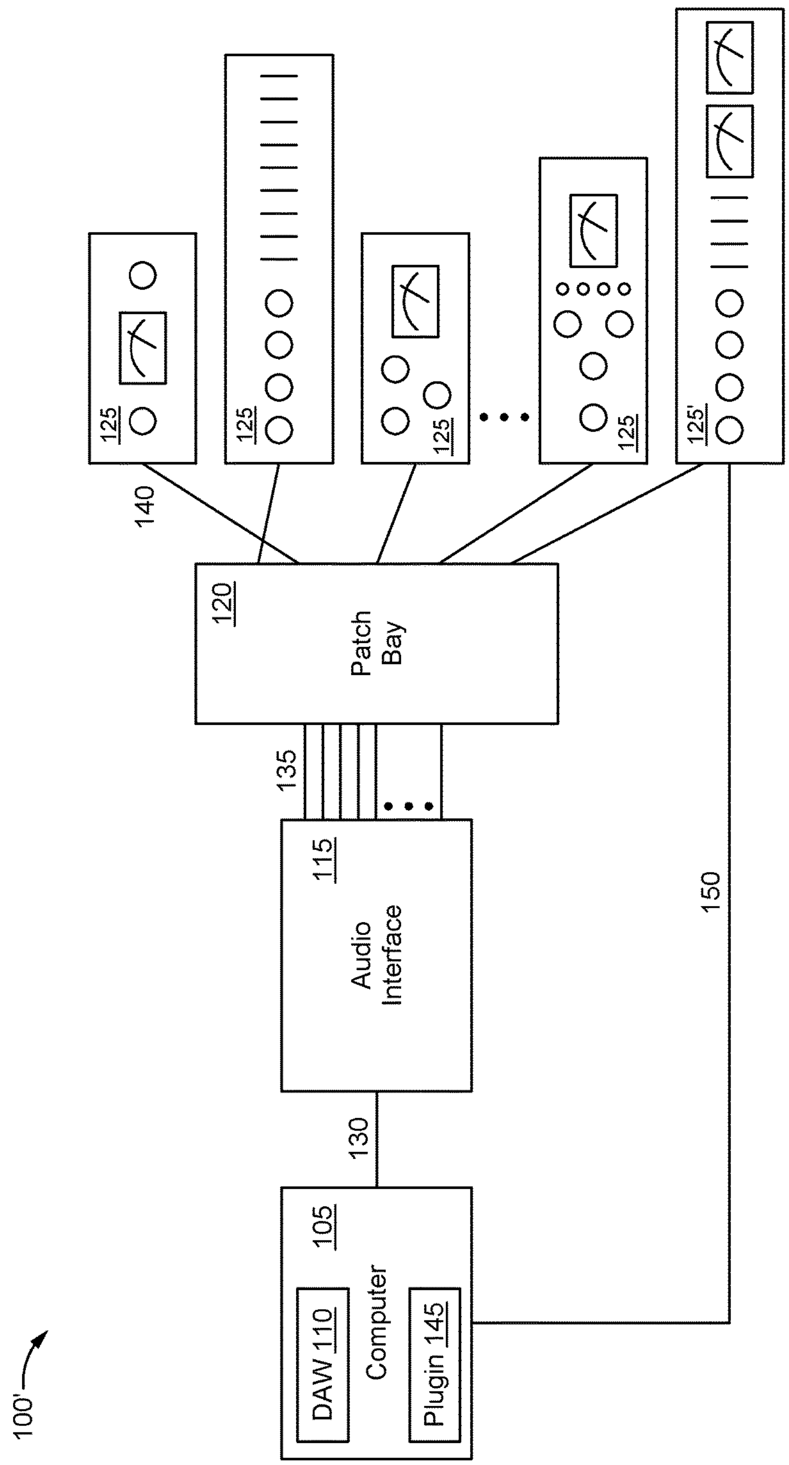

Each plugin 220 is associated with at least one analog algorithm in the APB 215 and includes a user interface configured to allow an end user to set parameters. In some embodiments, the user interface includes graphical knobs, switches, sliders, meters that are representative of physical, moving parts of traditional analog outboard gear 125 of FIGS. 1A and 1B (collectively, FIG. 1). Using these parameters that are set by the user via a plugin 220, the plugin 220 calculates all needed raw algorithm values and send them together with the audio signal to the APB 215, keeping perfect and complete synchronization between the audio and control signals via the connector 225 for a downstream analog domain process. Parameters set by the user via the plugin 220 can be saved and recalled as a preset. Automated parameters (parameters changing over time such as a volume change during a chorus) are relayed to the APB 215 by the plugin 220 as continuously updated raw algorithm values. In particular, the automation occurs in the plugin 220 and the audio workstation hosting the plugin 220, while the parameter changes (control automation) are recorded and played back by the audio workstation, and once received by the plugin 220, are converted to raw algorithm values and sent to the APB 215.

Once at the APB 215, the two signals, received via the connector 225, are simultaneously converted to the analog domain by the D/A converter circuit 230, the analog implementation of the audio algorithm is carried out at the processor circuit 235, and the result (output) from the processor circuit 235 is converted back to the digital domain by the A/D converter circuit 240 and returned to the computer 205 via the connector 225. The audio and control signals are kept in perfect synchronization as they enter the APB 215, creating a perfectly repeatable return output signal. The output signal from the APB 215 is perfectly reproducible not only by the same APB 215 but also across all APB as the control values can be exactly recalled and automatically updated (e.g., control values pertaining to a slow increase in volume over time to accentuate a given music track) each and every time by the software program and sent (together with the audio signal) to the APB 215, such as during audio playback.

There are numerous advantages of binding or combining the audio and control signals together into the same data stream for transmission. For example, the combination of signals in a single data path provides for all audio and control data to be always sent and therefore perfectly synchronized for the control of the APB 215, such as during audio playback. The combination of signals in a single data path also reduces component costs in the analog domain. As discussed elsewhere, the APB 215 includes fundamental elements of audio processing (multiply, add, accumulate) in the analog domain and lacks additional circuitry, such as circuitry to convert parameter data into raw algorithm values. In addition, the combination of signals in a single data path provides convenience of a single, simple connection between the computer 205 and the APB 215.

Figure 4:
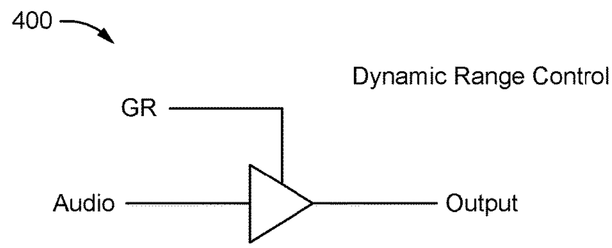
FIG. 4 illustrates an exemplary schematic of a dynamic range compression implementation in the analog domain.

Since the plugin 220 is able to calculate different sets of raw algorithm values based on user input via the plugin 220 and to provide the APB 215 with different control data, the APB 215 is able to have a variety of styles of processing. For example, dynamic range compression is an audio signal change that is processed in the analog domain, and this processing is dependent on a number of side chain signal conditions, all of which can be modeled by the plugin 220. FIG. 4 illustrates an exemplary schematic 400 of a dynamic range compression implementation in the analog domain. The implementation includes an analog multiplier that receives two inputs, an analog audio signal and an analog control signal, and multiples the two inputs to obtain an output value. Although not illustrated in FIG. 4, the output value from the multiplier can be saturated by passing through additional circuit elements to provide distortion. While the dynamic range compressor is configured to perform the same function, its sound can be very different between models of different side chain signal conditions. In effect, the APB 215 can have multiple compressor sounds, whereas a traditional analog device 125 of FIGS. 1A-1B would only have one distinct sound. The analog algorithm implemented in the APB 215 becomes configurable by the modification of side chain signal processing performed with the software in the digital domain. This configurable analog process is easily extended to other audio effects like equalizers, filters, summers and the like.

Figure 5:
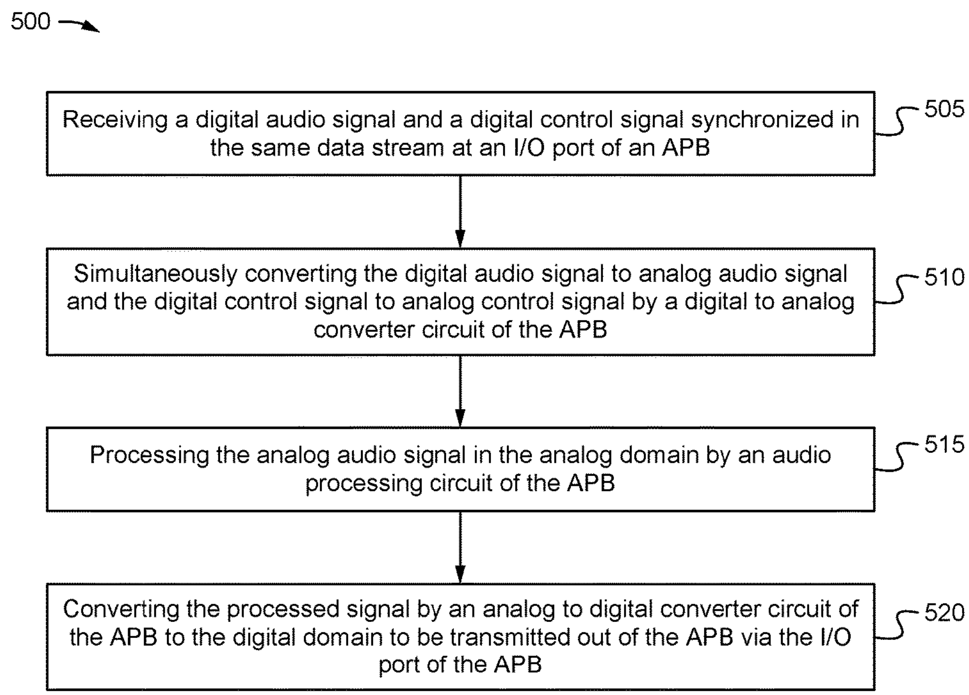
FIG. 5 illustrates an exemplary method of the APB of FIG. 2 in accordance with some embodiments.

FIG. 5 illustrates an exemplary method 500 of the APB 215 of FIG. 2 in accordance with some embodiments. In some embodiments, the APB 215 is a standalone device that is distinct and external from the computer 205 of FIG. 2. The APB and the computer are coupled using a multi-point connector. The multi-point connector is coupled at an input/output port of the APB for routing signals from the computer to the APB and for routing signals from the APB to the computer. A plugin is selected by a user. The plugin executing on the computer can be used to, inter alia, set parameters, calculate raw algorithm values, recall parameter resets, and automate update of control values, as discussed herein. At a step 505, a digital audio signal and a digital control signal synchronized in the same data stream are received at the input/output port of the APB from the computer via the multi-point connector. Within the APB, the signals are split into different streams of data.

At a step 510, a digital to analog converter circuit of the APB simultaneously converts the digital audio signal to analog audio signal and the digital control signal to analog control signal.

At a step 515, an audio processing circuit of the APB processes the analog audio signal in the analog domain. The audio processing circuit implements at least one algorithm, such as but not limited to a dynamic range control algorithm, signal summing algorithm, or a frequency equalization algorithm.

At a step 520, an analog to digital converter circuit of the APB converts the processed signal from the audio processing circuit to the digital domain to be transmitted out of the APB via the input/output port of the APB via the multi-point connector 225. The audio effect produced by the APB is perfectly reproducible by the APB since control values can be exactly recalled and automatically updated each and every time by the computer and sent (together with the audio signal) to the APB.

However, based on control processing at the computer, the APB is also able to provide a first audio effect and a second audio effect that is different from the first audio effect on the same audio signal by using a first set of control data for the first audio effect and a second set of control data that is different from the first set for the second audio effect, wherein the first set of control data and the second set of control data are received at different times from the computer. The delivery of the audio data and the first set of control data are synchronized for processing in the APB. Likewise, the delivery of the audio data and the second set of control data are synchronized for processing in the APB. It should be noted that although only two audio effects are described, there could be more than two audio effects in the APB. This scenario can be extended to more than two audio effects running concurrently within the APB. Based on how the APB is configured by the user, the APB can run a different audio effect on every channel of audio coming into the APB.

A critical element of having a highly desirable "analog process" for audio production is that the audio signal is processed in the analog domain. As discussed herein, parameter calculations, side-chain processing and other parts of the system are digitally controlled, while the audio signal changes are performed in the analog domain. The combining of the audio and control signals in a single data path for perfect synchronization of the audio and control data is for the control of the analog domain (e.g., an analog signal processing device such as the APB 215). However, it is contemplated that the combined audio and control signals can also be for the control a digital signal processing device.

The analog circuits in the APB are programmable after the analog hardware is manufactured. Specifically, reconfiguration of analog algorithm is obtained via software control, with updates and new features added via software control, well after the analog circuits have been created. Reconfiguration allows different algorithms to be realized with the same analog hardware. Audio effects could include dynamic range compression, equalization, filtering, upwards and downwards expansion, gating, and delay based effects like "echo" and pitch shifting. Such reconfiguration capability allows for a variety of models (styles) of each effect. Several different dynamic range compressors, equalizers, filters or a combination of these and other effects can be realized. Unlike traditional analog outboard gear 125 of FIG. 1 that is known for a distinctive sound per device/brand, the APB is a purely analog process that offers modeling of a variety of sounds of audio effect processes.

The cost of manufacturing an APB 215 is significantly less than the cost of a traditional analog outboard box 125 of FIG. 1 because the APB 215 lacks additional circuitry, such as circuitry to convert parameter data into raw algorithm values. Parameter data is received as user input via the user interface of the plugin 220. The APB 215 also has no moving parts, such as knobs, switches, sliders, that can be damaged by an end user. Since the APB 215 lacks additional circuitry and moving parts, manufacturing errors are also minimized. Reduction in manufacturing expenses allows the APB 215 to be able to process 4×, 8×, 16× or more as many audio channels as a comparable single channel state of the traditional analog outboard box 125 for the same cost.

Furthermore, no expensive audio cable connectors are required to use the APB 215 since all audio data is carried on the multi-point connection 225 between the APB 215 and the computer 205. Data bandwidth of the multi-point connection 225, such as Thunderbolt, allows many audio channels to be routed to and from the APB 215. Multi-point connection technology allows more than one APB 215 to be connected to a single computer 205, offering an even greater number of audio channels. In some embodiments, the APB 215 includes a plurality of input/output ports such that the APB 215 can be coupled with one or more other APBs 215 and/or other devices, such as in a daisy-chain, using the same cable protocol (e.g., Thunderbolt). Each coupled APB is able to process channels of inputs and outputs of its own, allowing for an increased total number of channels of processing.

The separation of algorithms into an all-digital control processing component and an all-analog signal processing component has numerous benefits, including low power consumption in the all-analog signal processing component. All settings and controls are digitally set by end users and can be perfectly recalled and automatically updated each time by the computer, such as during audio playback. Only fundamental processing—multiply, add, accumulate—is done in the analog domain of the signal processing component. The all-analog signal processing component is configurable/controllable by the all-digital control processing component. The control data can change over time but will always be in sync with the audio data when transmitted to the all-analog signal processing component for processing.

As demonstrated herein, the system of the present invention allows for digital or software control of analog processing of audio signals and, at the same time, reduces the number of components needed to perform the analog processing. Furthermore, in the cases of parameter automation, parameter changes and audio signal are completely synchronized. Reconfiguration of the analog algorithm is via the software control.

One of ordinary skill in the art will realize other uses and advantages also exist. While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

I claim:

1. A system for music production, comprising:

a bi-directional communication path;

an all-digital control processing component configured to:

calculate raw algorithm values to obtain a digital control signal; and combine a digital audio signal and the digital control signal together in the same data stream for transmission via the bi-directional communication path to an analog domain; and an all-analog signal processing component coupled with the all-digital control processing component via the bi-directional communication path, wherein the all-analog signal processing component is configured to receive the digital audio signal and the digital control signal synchronized in the same data stream via the bi-directional communication path, and is configured to thereby provide an audio effect using the received digital audio and digital control signals, and is configured to return the audio effect in a different form suitable to the all-digital control processing component via the bi-directional communication path.

2. The system of claim 1, wherein the all-digital control processing component is executed on a computing device.

3. The system of claim 2, wherein the all-digital control processing component is also configured to generate a graphical user interface on the computer to receive user input, wherein the raw algorithm values are calculated based on the user input.

4. The system of claim 3, wherein the all-digital control processing component is also configured to recall settings previously set.

5. The system of claim 3, wherein the all-analog signal processing component is configured to automatically receive update of control values during playback such that control changes can be recorded and repeated with the playback.

6. The system of claim 3, wherein the all-analog signal processing component includes:

a digital to analog converter circuit to simultaneously convert the digital audio signal to analog audio signal and to convert the digital control signal to analog control signal;

an audio processing circuit implementing at least one algorithm for processing the analog audio signal in the analog domain; and an analog to digital converter circuit to convert an output from the audio processing circuit to the digital domain to be returned to the all-digital control processing component.

7. The system of claim 6, wherein implementation of the at least one algorithm is a combination of only raw algorithm functions including multiply, add and accumulate functions.

8. The system of claim 7, wherein the at least one algorithm implemented by the audio processing circuit is configurable by modification of the digital control signal in the all-digital control processing component.

9. The system of claim 8, wherein the at least one algorithm implemented by the audio processing circuit in the all-analog signal processing component is a dynamic range control algorithm.

10. The system of claim 8, wherein the at least one algorithm implemented by the audio processing circuit in the all-analog signal processing component is a signal summing algorithm.

11. The system of claim 8, wherein the at least one algorithm implemented by the audio processing circuit in the all-analog signal processing component is a frequency equalization algorithm.

12. The system of claim 8, wherein the all-analog signal processing component is a standalone device that is distinct and external from the computing device.

13. The system of claim 12, wherein the all-analog signal processing component does not have any circuitry to calculate control signals and does not have any physical moving controls.

14. An all-analog signal processing component, comprising:

an input/output port configured to couple with a multi-point connector and to receive a digital audio signal and a digital control signal synchronized in the same data stream via the multi-point connector;

a digital to analog converter circuit to simultaneously convert the digital audio signal to analog audio signal and to convert the digital control signal to analog control signal;

an audio processing circuit implementing at least one algorithm for processing the analog audio signal in the analog domain; and an analog to digital converter circuit to convert an output from the audio processing circuit to the digital domain to be transmitted out of the all-analog signal processing component via the input/output port.

15. The all-analog signal processing component of claim 14, wherein implementation of the at least one algorithm is a combination of only raw algorithm functions including multiply, add and accumulate functions.

16. The all-analog signal processing component of claim 15, wherein the all-analog signal processing component does not have any circuitry to calculate control signals and does not have any physical moving controls.

17. The all-analog signal processing component of claim 16, wherein the all-analog signal processing component is configured to be communicatively coupled with a computing device such that the digital audio signal and the digital control signal are received from the computing device, and the converted output from the audio processing circuit is returned to the computer.

18. The all-analog signal processing component of claim 17, wherein the at least one algorithm implemented by the audio processing circuit is configurable by modification of the digital control signal received from the computer.

19. A method of an all-analog signal processing component that is configured to be communicatively coupled with a computing device, wherein the all-analog signal processing component is a standalone device that is distinct and external from the computing device, comprising:

receiving a digital audio signal and a digital control signal synchronized in the same data stream at an input/output port of the all-analog signal processing component from the computing device;

simultaneously converting the digital audio signal to analog audio signal and the digital control signal to analog control signal by a digital to analog converter circuit of the all-analog signal processing component;

processing the analog audio signal in the analog domain by an audio processing circuit of the all-analog signal processing component, wherein the audio processing circuit implements at least one algorithm; and converting the processed signal by an analog to digital converter circuit of the all-analog signal processing component to the digital domain to be transmitted out of the all-analog signal processing component via the input/output port of the all-analog signal processing component.

20. The method of claim 19, further comprising providing a first effect and a second effect that is different from the first effect on the received audio signal by using a first set of control data for the first effect and a second set of control data that is different from the first set for the second effect.

* * * * *